United States Patent [19]

Jackson et al.

[11] Patent Number: 4,815,204

[45] Date of Patent: Mar. 28, 1989

[54] ELECTRONIC COMPONENT INSERTION MACHINE

[75] Inventors: Rodney P. Jackson, Auburn, N.H.; Naum M. Kaminsky, Marblehead, Mass.

[73] Assignee: Emhart Industries, Inc., Farmington, Conn.

[21] Appl. No.: 182,863

[22] Filed: May 2, 1988

[51] Int. Cl.⁴ .............................................. B23P 19/04
[52] U.S. Cl. ....................................... 29/741; 356/399; 356/394
[58] Field of Search ................. 29/741, 739, 740, 720, 29/721; 356/399, 400, 394

[56] References Cited

U.S. PATENT DOCUMENTS

| | | |
|---|---|---|
| 4,403,406 | 9/1983 | Foley ................................. 29/721 |
| 4,686,565 | 8/1987 | Ando ................................. 358/101 |
| 4,696,047 | 9/1987 | Christian et al. ..................... 382/8 |

Primary Examiner—P. W. Echols
Assistant Examiner—Kevin Jordan
Attorney, Agent, or Firm—Spencer T. Smith

[57] ABSTRACT

A machine for insering DIP components has two adjacent insertion stations so that DIP components having two different sizes can be inserted. The inserted leads of a component inserted at either location are backlighted and a compound mirror redirects the component image to a selected portion of the imaging areas of a camera where the leads appear as two spaced rows of black leads.

3 Claims, 3 Drawing Sheets

ELECTRONIC COMPONENT INSERTION MACHINE

A dual in-line package (DIP) component insertion machine inserts DIP components into a supported circuit board. It is important to verify that all the component leads have been properly inserted and camera based lead verification systems have been developed for machines having a single insertion head. One such system is disclosed in U.S. patent application Ser. No. 29,834, filed on Mar. 24, 1987.

It is an object of the present invention to provide a camera based lead verification system for a machine having a pair of insertion heads.

Other objects and advantages of the present invention will become apparent from the following portion of the specification and from the following drawings which illustrate in accordance with the mandate of the patent statutes a presently preferred embodiment incorporating the principles of the invention.

Referring to the drawings.

Figure 1:
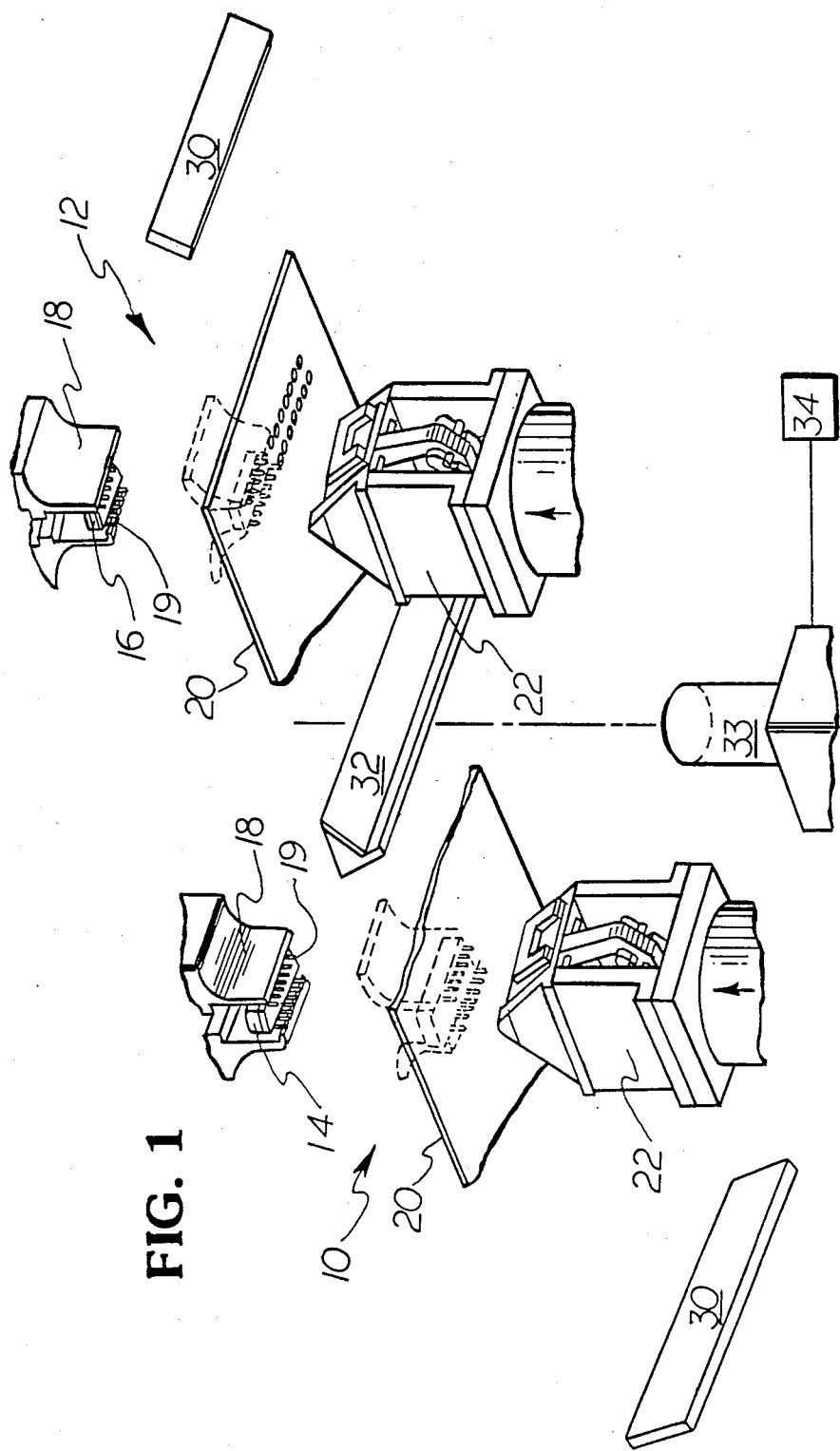
FIG. 1 is an oblique view of a portion of a DIP component insertion machine made in accordance with the teachings of the present invention.
Figure 2:
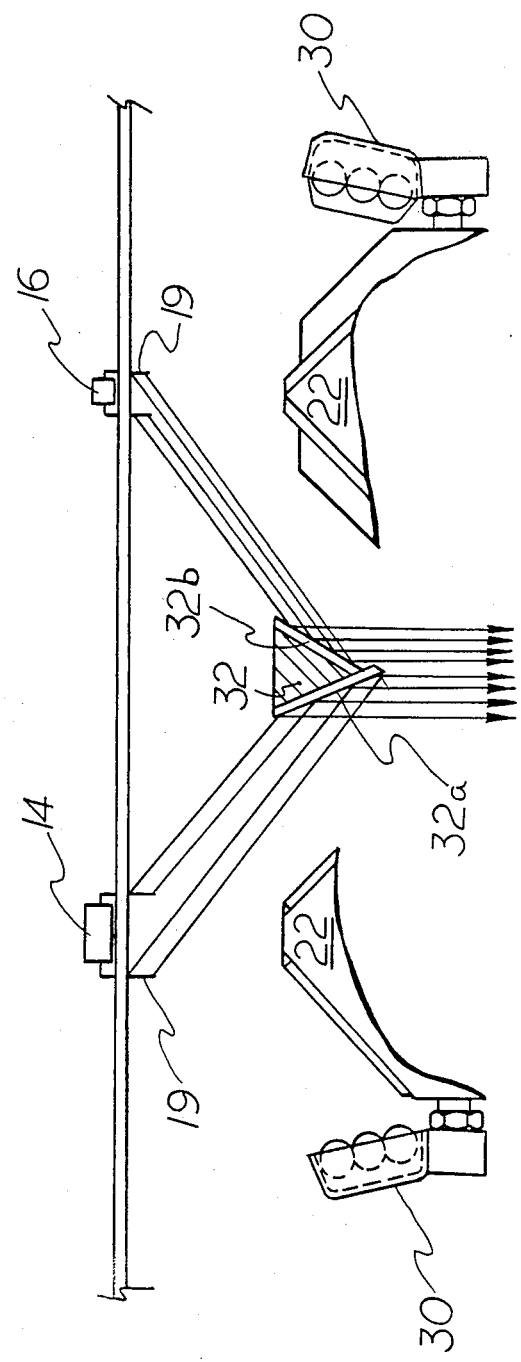
FIG. 2 is a schematic view of the lead imaging system shown in FIG. 1 taken in the direction of the rows of component leads with inserted components present at each of the insertion locations.

The component insertion machine of insertion stations 10, 12 each dedicated to a component having a specific size. As illustrated, the left hand station 10 handles DIP components 14 having a first size (lead to lead spacing of 0.600 inch, for example), while the right hand station 12 handles a smaller DIP 16 (a lead to lead spacing of 0.300 inch, for example). Each station has an insertion mechanism including a pair of grippers 18 which grip the component. The gripped component is lowered until the component leads 19 are partially inserted into receiving holes in a supported circuit board 20. The grippers release the partially inserted component and a pusher (not shown) is lowered to fully seat the component (the insertion heads operate sequentially following circuit board displacement to position the circuit board at the proper component receiving position). The leads of an inserted component will be parallel and lie in two spaced parallel planes, and the leads of an inserted large component will be in side-by-side relation with the inserted leads of a small component. Once inserted, the associated cut and clinch mechanism 22 cuts the fully inserted leads 19 to size and crimps the leads to secure the component to the circuit board.

Figure 3:
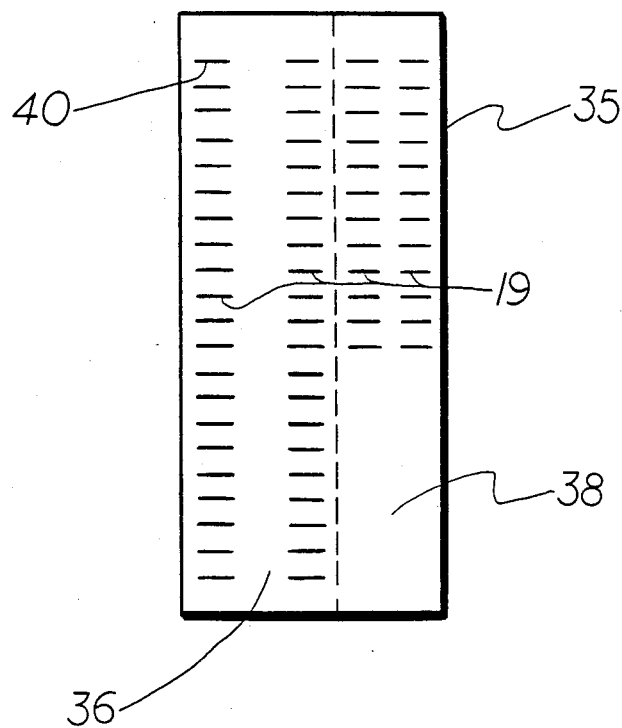
FIG. 3 is a view showing how the leads of a component inserted at each insertion location would appear to the camera.

Horizontally extending, slightly inclined fluorescent lights 30 backlight the fully inserted leads 19 and the black lead images are redirected by surfaces of a linear mirror 32 to a camera 33. FIG. 3 illustrates how the leads of a 0.600 component having the maximum twenty-one leads per side and a 0.300 component having twelve leads per side would appear to the camera, but only one component would be seen by the camera at any one time. As illustrated, the leads of a large component line up in front (at the top of FIG. 3) with the leads of the small component. These images can be evaluated by a computer 34 to verify that all leads have been properly inserted. The cut-clinch heads are separated to permit the camera to view the mirror 32.

The imaging area 35 of the camera is schematically illustrated in FIG. 3. The area 36 to the left of the dotted line is the 0.600 component imaging area, and the imaging area 38 to the right of the dotted line is the 0.300 component imaging area. The first surface 32a of the mirror 32 reflects the light from the left hand light source vertically down to the 0.600 component imaging area 36 of the camera so that the opposed rows of backlighted leads 19 will image as opposed rows of black lines 40. Similarly, since an inserted 0.300 component is transversely to the side of an inserted 0.600 component with the end leads lined up at the top end of the components, a second surface 32b of the mirror 32 can reflect light from the right hand light source vertically down to the 0.300 component imaging area 38 with the backlighted leads imaging as opposed rows of black lines 40.

We claim:

1. A machine for inserting DIP components having opposed rows of parallel leads comprising
   a first insertion mechanism for downwardly inserting a DIP component having a first size into a supported circuit board,
   a second insertion mechanism spaced from said first insertion mechanism for downwardly inserting a DIP component having a second size into a supported circuit board, said second insertion mechanism inserting a component at a location transverse to the location whereat said first insertion mechanism inserts a component,
   camera means, viewing vertically upwardly between said first and second insertion mechanisms and including first and second adjacent imaging areas,
   mirror means below the supported circuit board and parallel to and intermediate components inserted at said first and second insertion locations, said mirror means including a first planar mirror surface for reflecting the images of the leads of one size of component onto said first imaging area in spaced rows of discrete lead images and including a second planar mirror surface for reflecting the images of the leads of the second size component onto said second imaging area in spaced rows of discrete lead images, whereby said images can be evaluated to verify that leads have been properly inserted.

2. A machine according to claim 1 further comprising first light source means below the circuit board and located transversely from said mirror means at the side of said first insertion mechanism opposite said mirror means, whereby the leads of the first size component will image as black lines on said first imaging area and second light source means below the circuit board and at the side of said second insertion mechanism opposite said mirror means whereby the leads of the second size component will image as black lines on said second imaging area.

3. A machine according to claim 2, wherein said first and second light source means are each linear fluorescent lights.

* * * * *